United States Patent
Yeager et al.

(10) Patent No.: US 6,891,400 B2
(45) Date of Patent: May 10, 2005

(54) DUAL RAIL TIME BORROWING MULTIPLEXER

(75) Inventors: Hans L. Yeager, Folsom, CA (US); Scott E. Siers, Elk Grove, CA (US); Andrew D. Gerwitz, Granite Bay, CA (US)

(73) Assignee: Intel Corporation, Santa Clara, CA (US)

( * ) Notice: Subject to any disclaimer, the term of this patent is extended or adjusted under 35 U.S.C. 154(b) by 96 days.

(21) Appl. No.: 10/425,594

(22) Filed: Apr. 30, 2003

(65) Prior Publication Data

US 2004/0217779 A1 Nov. 4, 2004

(51) Int. Cl.[7] .................. H03K 19/096; H03K 17/62; H03K 17/76; H04J 3/02
(52) U.S. Cl. .................... 326/98; 327/410; 370/537
(58) Field of Search ............... 326/95, 98, 93, 326/82; 365/49, 191, 189.02; 327/410, 407, 408; 370/366, 537; 341/141

(56) References Cited

U.S. PATENT DOCUMENTS

| | | | |
|---|---|---|---|
| 5,955,912 A * | 9/1999 | Ko ........................ 327/410 |
| 6,046,606 A * | 4/2000 | Chu et al. .................. 326/95 |
| 6,072,732 A * | 6/2000 | McClure .................... 365/191 |
| 6,201,415 B1 * | 3/2001 | Manglore ................... 326/98 |
| 6,225,826 B1 * | 5/2001 | Krishnamurthy et al. ..... 326/93 |
| 6,239,620 B1 * | 5/2001 | Aoki et al. ................. 326/95 |
| 6,266,757 B1 * | 7/2001 | Desai et al. ................ 711/220 |
| 6,366,130 B1 * | 4/2002 | Podlesny et al. ............ 326/95 |
| 6,421,758 B1 * | 7/2002 | Buti ......................... 711/108 |
| 6,442,055 B1 * | 8/2002 | Busch et al. ................ 365/49 |
| 6,526,542 B2 * | 2/2003 | Kondratyev .................. 716/2 |
| 6,573,755 B2 * | 6/2003 | Fletcher et al. ............. 326/95 |
| 6,819,139 B2 * | 11/2004 | Kim ......................... 326/82 |

OTHER PUBLICATIONS

Bernstein et al., "High Speed CMOSDesign Styles."; pp. 111–114; Kluwer Academic Publishers, 1999.

* cited by examiner

*Primary Examiner*—Patrick Wamsley
(74) *Attorney, Agent, or Firm*—Fleshner & Kim, LLP

(57) ABSTRACT

A Dual Rail Time Borrowing Multiplexer (DTBM) generates a dual rail output from a single rail input with a one gate equivalent delay using a negative set up time. In one embodiment, a multiplexer includes a cross-coupled differential domino circuit coupled to a transistor array and to a data input and an enable input through a first and second circuit. The multiplexer outputs a dual rail output corresponding to a selected data input with a one gate equivalent delay using a negative set up time.

33 Claims, 14 Drawing Sheets

| | TIME UNITS COUGAR | GLITCH ON OPPOSITE OUTPUT (mV) | AMOUNT BORROWED *_en/clk-rise (ps) | TIME UNITS PM_TA | NOTES |
|---|---|---|---|---|---|
| BOL(1.1V,PTZST) | | | | | |
| CLK → OUT0 | 36 | - | - | 33 | COUGAR IS RIGHT. FINAL DRIVE TO FULL VCC SLOW BUT PM_TA ASSUMES RAIL. |
| CLK → OUT0_B | 35 | - | - | 39 | PM_TA ASSUMES CMP_$V_{SS}$ NODE IC IS 1.1V INSTEAD OF $V_{CO}$-$V_{TN}$ |
| D → OUT0 | 57 | 20 | 21 | 51 | COUGAR IS RIGHT. AGAIN, FULL RAIL ON TRU_EN IS SLOW... |
| D → OUT0_B | 54 | 50 | 20 | 55 | MATCH MAKES SENSE SINCE NOR DRIVES CMP_EN |
| EN_B → OUT0 | 51 | 55 | 14 | 63 | ?? |
| EN_B → OUT0_B | 51 | 20 | 14 | 45 | ?? |
| NOISE(1.5V,RFFF) | | | | | 10% NOISE (1.35V, 0.15V) ON DATA AND EN_B INPUTS |
| CLK → OUT0 | 20 | - | - | - | |
| CLK → OUT0_B | 21 | - | - | - | |
| D → OUT0 | 35 | 100 | 11 | - | |
| D → OUT0_B | 30 | 120 | 11 | - | |
| EN_B → OUT0 | 29 | 100 | 10 | - | |
| EN_B → OUT0_B | 29 | 80 | 10 | - | |
| MINV_CC(0.9V,PTZST) | | | | | |
| CLK → OUT0 | 53 | - | - | - | |
| CLK → OUT0_B | 46 | - | - | - | |
| D → OUT0 | 78 | 22 | 24 | - | |
| D → OUT0_B | 74 | 8 | 22 | - | |
| EN_B → OUT0 | 70 | 6 | 17 | - | |
| EN_B → OUT0_B | 80 | 11 | 20 | - | |

FIG. 15

DUAL RAIL TIME BORROWING MULTIPLEXER

BACKGROUND OF THE INVENTION

1. Field of the Invention

The present invention relates to domino circuit topology. In particular, the present invention relates to a dual tail time borrowing multiplexer domino circuit topology using a complementary-device CMOS logic gate.

2. Background of the Related Art

Conventional microprocessors rely on several architectural and circuit techniques to maximize CPU performance, including but not limited to:

Zero-level Bypassing

Several ALUs

High-speed circuit techniques

Zero-level bypassing is an architectural technique to maximize the architectural performance of the CPU. In zero level bypassing, the output data from one ALU may be the input data to any other ALU in the next cycle and this can occur for all ALUs in parallel during one clock cycle. A physical block diagram is shown in FIG. 1. In this way, dependent instructions may be executed in consecutive clock cycles without waiting for the results of one instruction to be written back to a register file or other memory circuit.

This topology creates both timing and routing problems. Timing becomes difficult since every ALU must transmit its result to all other ALUs-some of which may be several hundred microns away. Also, each ALU must receive inputs from all other ALUs and therefore must employ a wide-multiplexer to choose the correct source data. Routing is also constrained by this topology. A microprocessor may have 5 ALUs. Therefore, it requires 5 wires per bit to provide ALU to ALU pathways, another pathway for incoming cache data, and another pathway to provide overrides for "immediate" data; a total of 7 pathways per bit. Five ALU's are shown in FIG. 1 as an example.

There is a fundamental speed limiting path that exists with zero-level bypassing. The path starts from the clock of the input multiplexer to the zero-level bypassing outputs. The path then proceeds from the bypassed outputs through the ALU to create a computational result. This computational result can be transmitted to the furthest ALU. The result must be transmitted before the setup time (relative to the next clock) of the furthest ALU's zero-level bypassing mux-latch. This path is fundamental in microprocessor designs and therefore high-speed circuit design techniques, such as domino circuit design, are very commonly employed to speed up this path.

The foregoing approach, while somewhat effective, is not without drawbacks. For example, domino structures exacerbate the routing problem since domino logic requires data and the logical inverse, data#, to be generated for certain ALU functions. Data and data# must be domino compatible. Therefore, fourteen pathways would be required in a conventional domino implementation, which is considered excessive. This many signals routed in a data path will lead to high interconnect resistance and capacitance. Thus, in very wide ALU stacks, it is generally not practical to route both data and data# from each ALU.

While routing single rail data between ALUs helps global timing, the first thing the ALU must do locally (either before or after the multiplexer) is to create data# from data. Note that when data# is generated locally with a simple inverter, it is not domino-compatible. Also, since there are so many inputs, a domino multiplexer is advantageous for speed purposes. One other caveat is that the enable signals (for the multiplexer) must have one enable signal at a logic high state at all times.

The foregoing constraints strip away the ability to time-borrow through a domino multiplexer. This situation creates an absolute hard timing edge (shown in FIG. 2), for which there can be no transparency, to prevent a false evaluation. In FIG. 2, the path starts in one ALU at time "t0" at the domino multiplexer with "clk→out" representing the amount of time to generate valid outputs of the multiplexer after the arrival of the clock edge. "ALU delay" is the propagation time through the ALU in addition to the delay from the output of the ALU all the way back to the input of the next ALU. The signal must complete its propagation and setup to the multiplexer input prior to the rising edge of the next clock cycle. This means the design must pay the full penalty of clock skew and jitter—which can be a high percentage of the total cycle time.

These and other disadvantages exist in conventional circuitry.

BRIEF DESCRIPTION OF THE DRAWINGS

The invention will be described in detail with reference to the following drawings in which like reference numerals refer to like elements wherein:

FIG. 15 illustrates a table of maximum time borrowing for a dual rail time borrowing multiplexer both in typical speedpath conditions as well as noise conditions according to one embodiment of the invention.

DETAILED DESCRIPTION OF PREFERRED EMBODIMENTS

Figure 1:
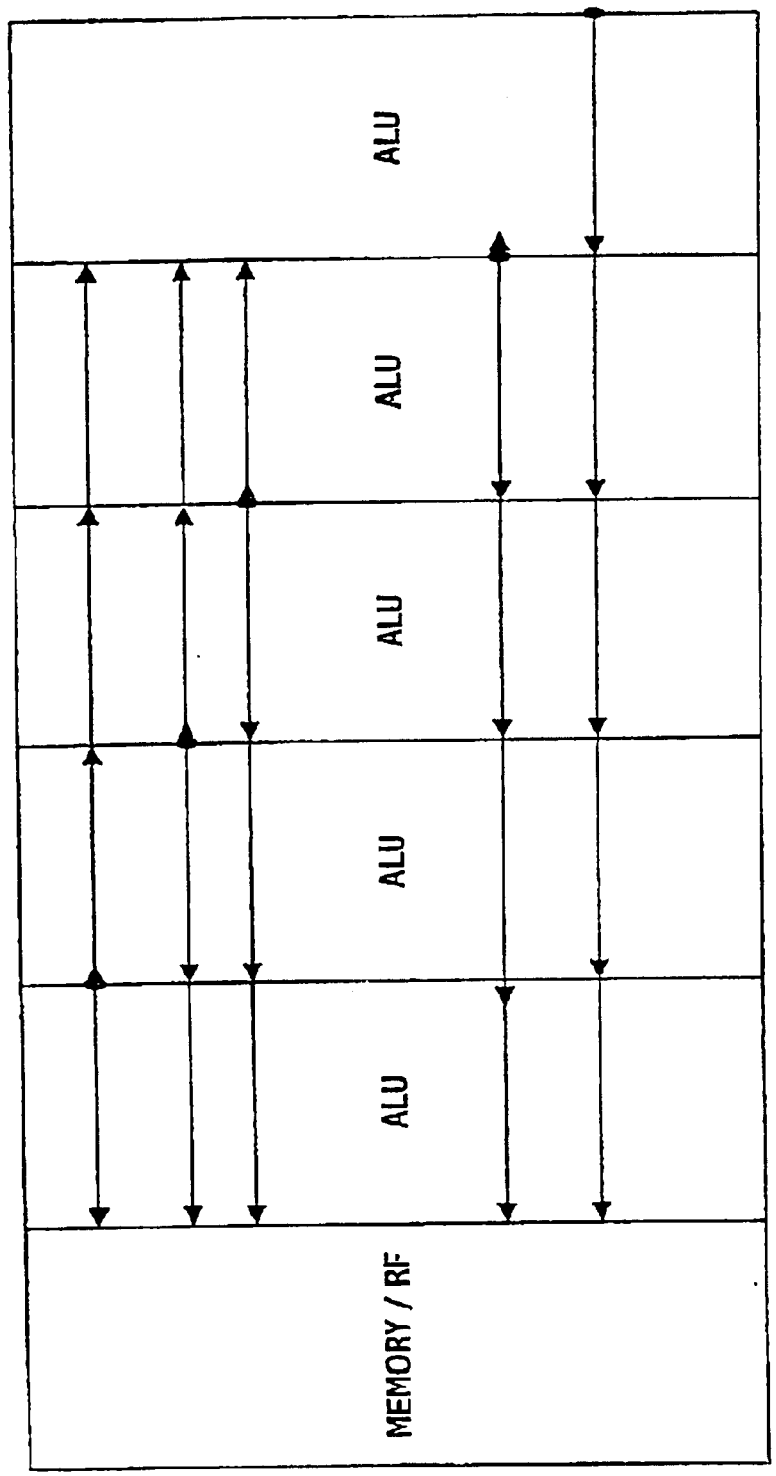
FIG. 1 illustrates an example of multiple ALUs in a stack with zero-level bypass capability.
Figure 2:
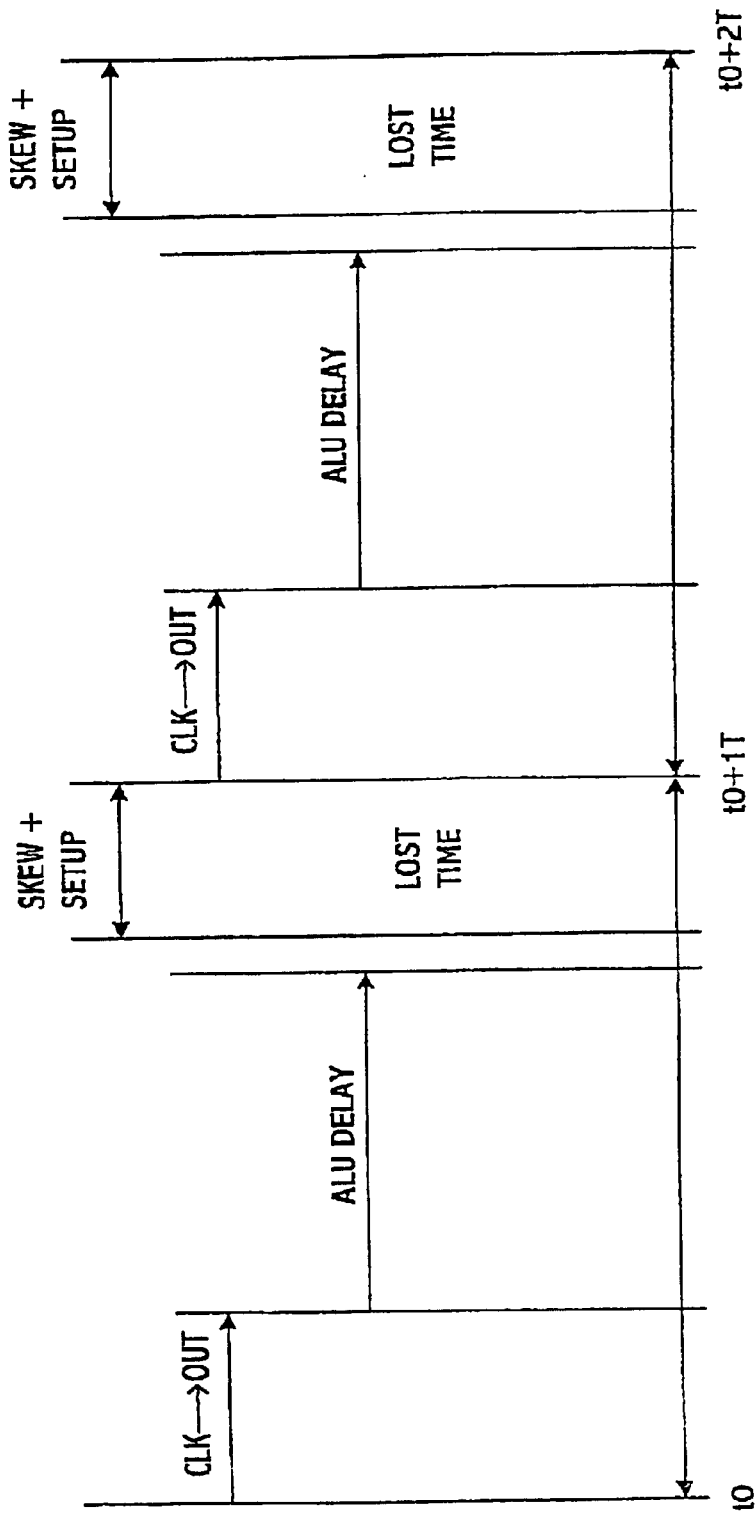
FIG. 2 illustrates the timing problem associated with zero-level bypassing.

In the following detailed description of preferred embodiments, reference is made to the accompanying drawings that show, by way of illustration, specific embodiments in which the invention may be practiced. In the drawings, like numerals describe substantially similar components throughout the several views. These embodiments are described in sufficient detail to enable those skilled in the art to practice the invention. Other embodiments may be utilized, and structural, logical, and intellectual changes may be made without departing from the scope of the present invention. Moreover, it is to be understood that various embodiments of the invention, although different, are not necessarily mutually exclusive. For example, a particular feature, structure, or characteristic described in one embodiment may be included within other embodiments. The following detailed description is not to be taken in a limiting sense, and the scope of the present invention is defined only by appended claims, along with the full scope of equivalence to which such claims are entitled.

Figure 3:
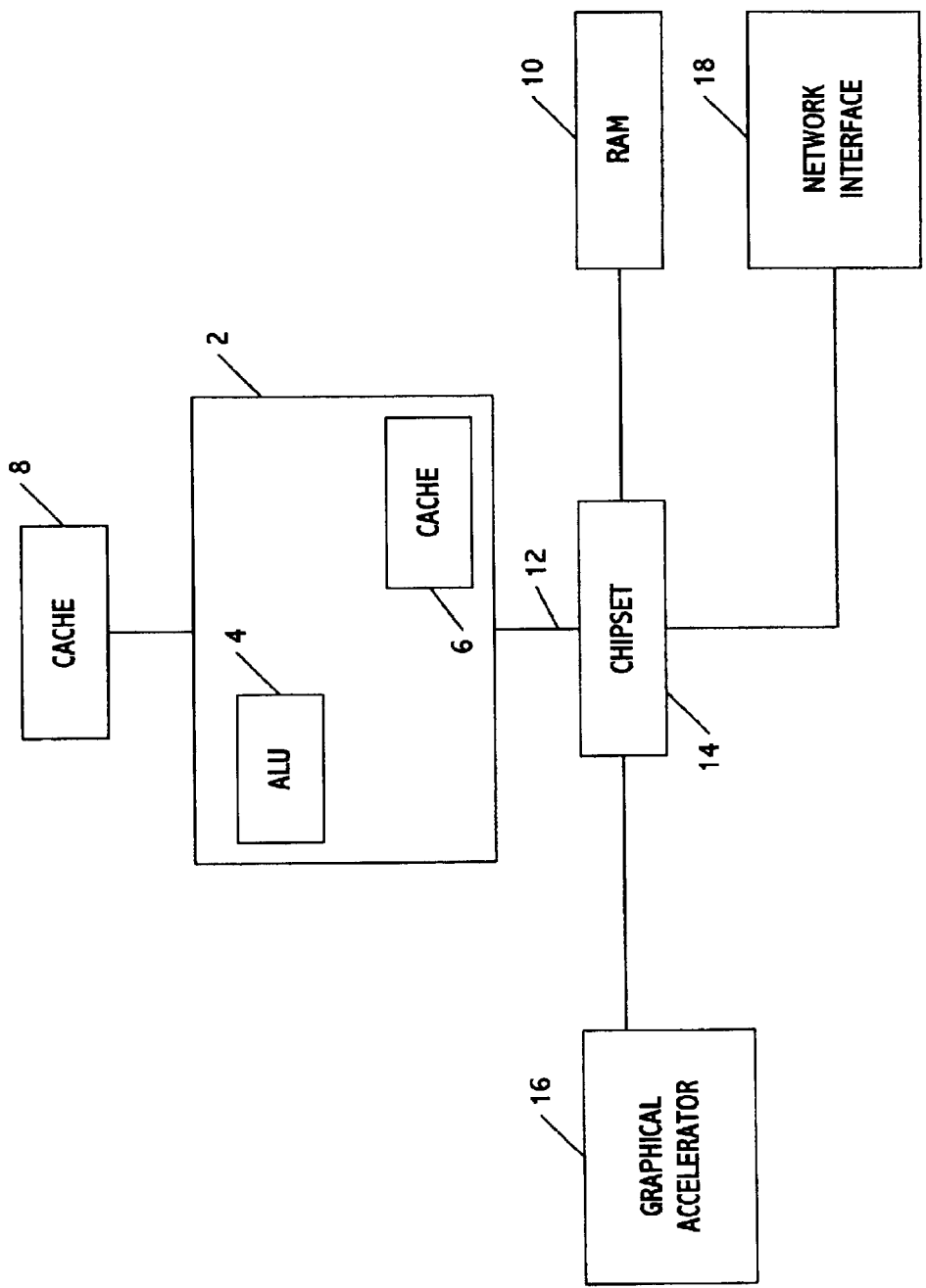
FIG. 3 illustrates an example of a computer system.

An embodiment of the present invention relates to multiplexers for use in a wide variety of applications including computer systems. FIG. 3 shows an exemplary illustration of a computer system. The computer system may include a microprocessor 2, which can include many sub-blocks such as an arithmetic logic unit (ALU) 4 and an on-die cache 6. The microprocessor 2 may also communicate to other levels of cache, such as off-die cache 8. Higher memory hierarchy levels such as system memory 10 may be accessed via host bus 12 and a chip set 14. In addition, other off-die functional units such as a graphics accelerator 16 and a network interface controller 18, to name just a few, may communicate with the microprocessor 2 via appropriate busses or ports.

Figure 4:
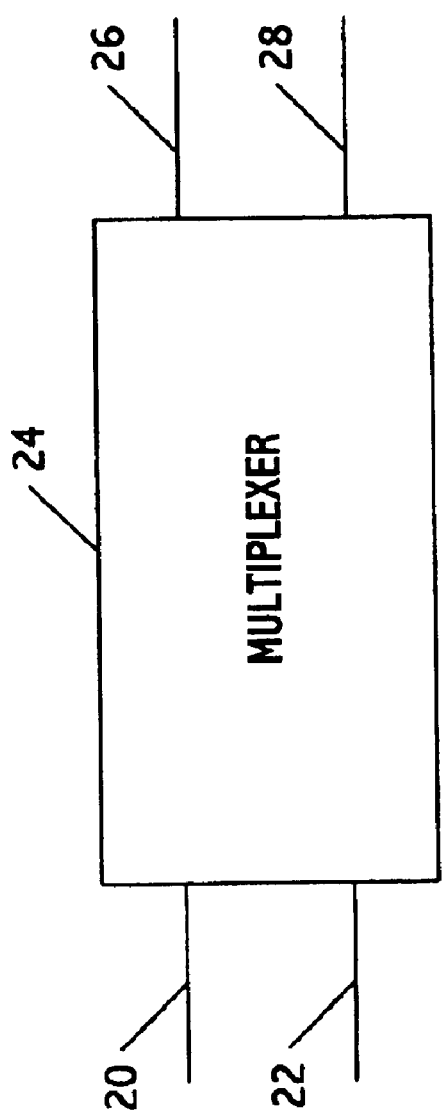
FIG. 4 illustrates a block diagram of a multiplexer according to one embodiment of the invention.

FIG. 4 illustrates an embodiment of the present invention. As shown, data lines 20 and enable lines 22 are input into a circuit 24. The circuit 24 performs a multiplexer process on the inputs 20 and 22, and outputs an output 26 and its complement 28. The circuit 24 receives a single rail data signal input on data line 20 and outputs a dual rail domino compatible output (26 and 28) in a time such that: clock_to bypass_out+ALU delay+ALU_to_ALU_transmission+ bypass_setup+skew<clock period. This embodiment may speedup the clock->bypass_out and improve the bypass_ setup times so that it becomes negative. Thus, the clock period may be reduced while requiring only single-rail inputs.

Figure 5:
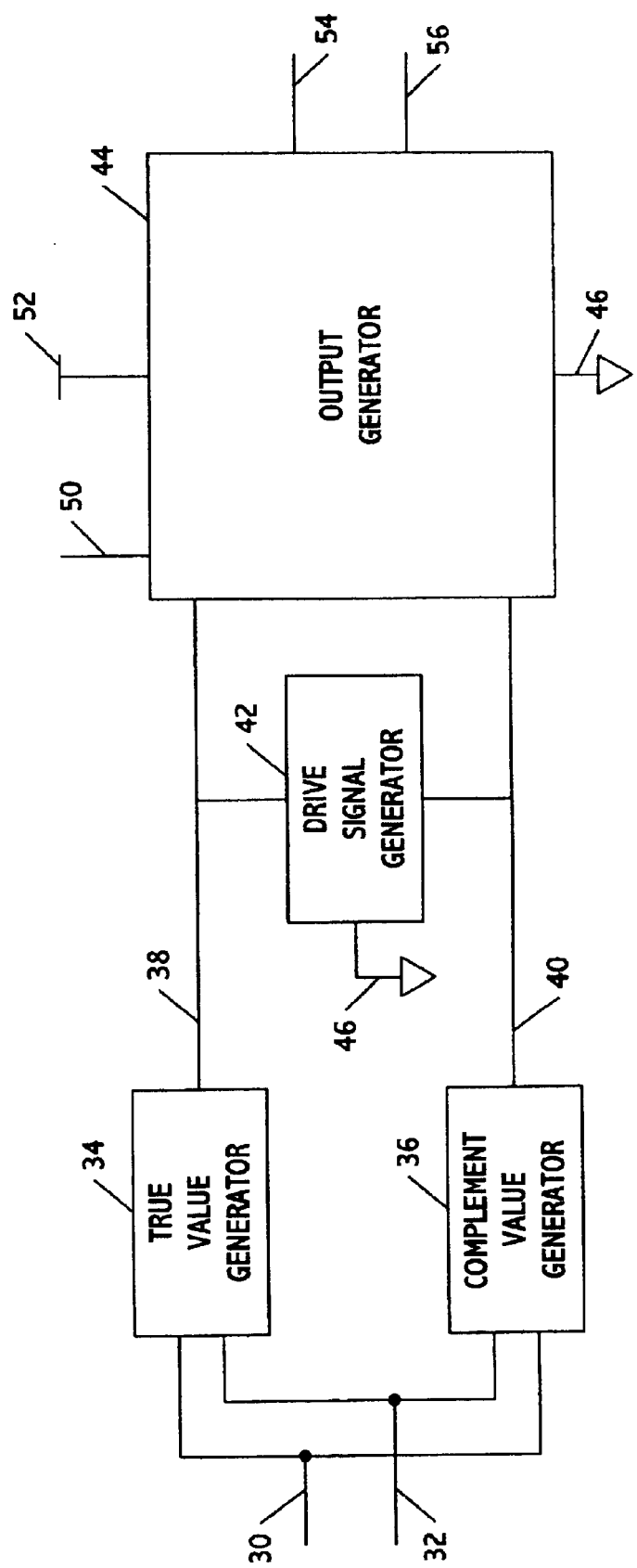
FIG. 5 illustrates a block diagram of a multiplexer circuit according to one embodiment of the invention.

FIG. 5 illustrates an embodiment of the present invention. As shown, data lines 30 that carry data signals and enable lines 32 that carry enable signals are each input into a first circuit 34 and a second circuit 36. The first circuit 34 generates true values of the data signals when enabled by the enable lines 32 and outputs those signals on first circuit output lines 38. The second circuit 36 generates complements of the data signals when enabled by the enable lines 32 and outputs those signals on second circuit output lines 40. The complement signals on output lines 40 are an input into a third circuit 42 and a fourth circuit 44. The true signals on output lines 38 are an input into a fourth circuit 44. The third circuit 42 is also coupled to a first reference voltage 46. The third circuit 42 uses the complement values input from output lines 40 to generate a driving signal output on line 38. In addition to receiving the true and complement signals on output lines 38 and 40, the fourth circuit 44 also receives a clock signal input on clock line 50 and is coupled to a second reference voltage 52 as well as the first reference voltage 46. The fourth circuit 44 uses the inputs from output lines 38 and 40 to generate a first output on output line 54 and a second output on output line 56. The first output represents the true value of the data signal input on data line 30 and the second output represents the complement of the data signal input on data line 30.

Figure 6:
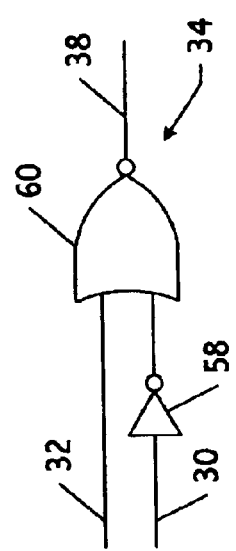
FIG. 6 illustrates an example of a first circuit of a multiplexer circuit according to one embodiment of the invention.

FIG. 6 illustrates an abstracted logic-level embodiment of the first circuit 34. As shown, a data signal is input on data line 30 to an inverter 58. The first inverter 58 generates an inverted value (complement value) of the data signal and inputs that into a NOR gate 60. The NOR gate 60 also inputs an enable signal on enable line 32. The NOR gate 60 generates a true value of the data signal based on the enable signal input and the inverted data signal input, and outputs it on the output line 38.

Figure 7:
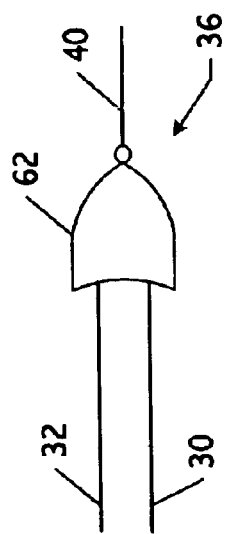
FIG. 7 illustrates an example of a second circuit of a multiplexer circuit according to one embodiment of the invention.

FIG. 7 illustrates a logic-level embodiment of the second circuit 36. As shown, a data signal is input on data line 30 to a NOR gate 62. The NOR gate 62 also inputs an enable signal on enable line 32. The NOR gate 62 generates a complement value of the data signal based on the enable signal input and the data signal input, and outputs it on the output line 40.

Figure 8:
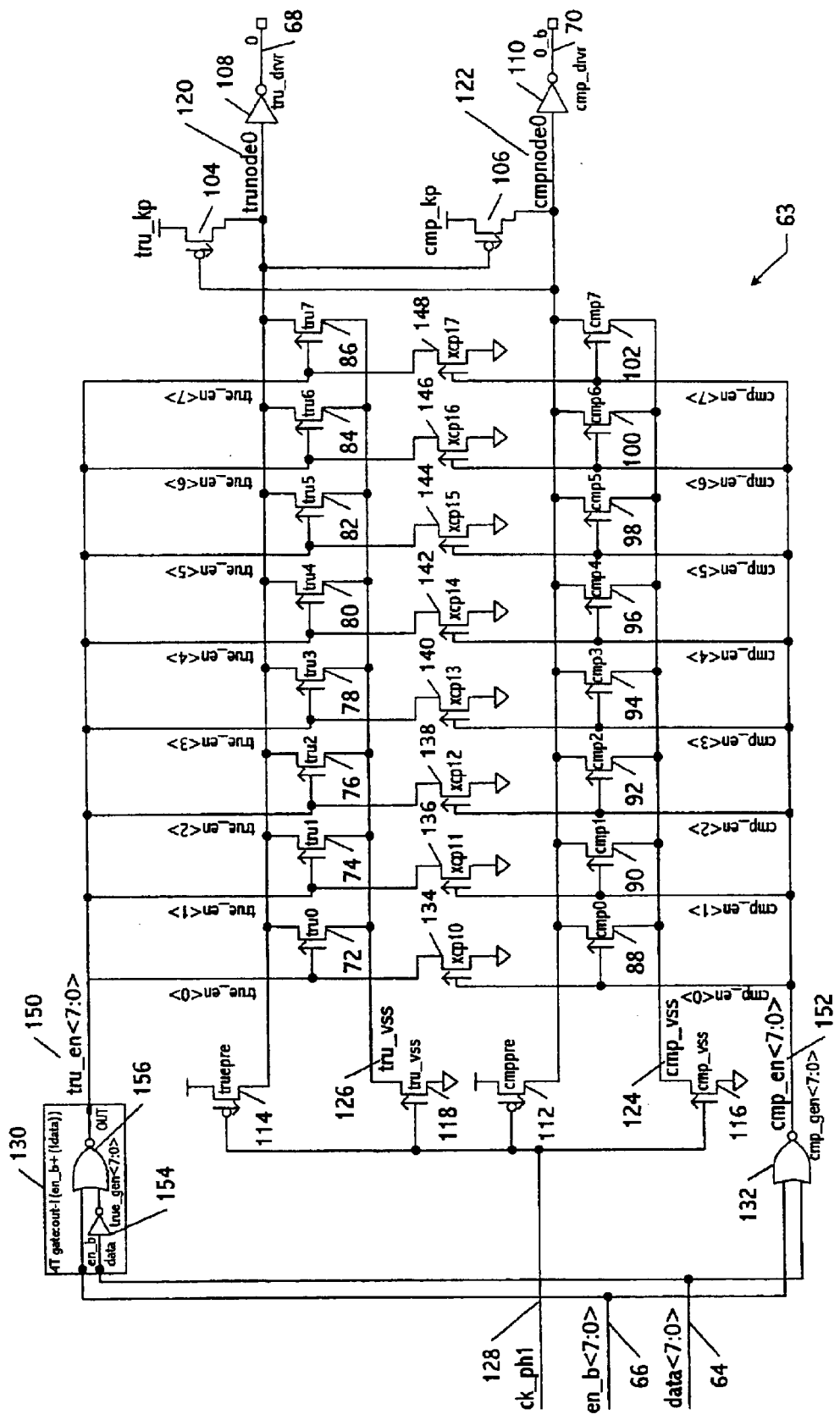
FIG. 8 illustrates a simplified circuit diagram of a dual rail time borrowing multiplexer according to one embodiment of the invention.

FIG. 8 illustrates a dual rail time borrowing multiplexer (DTBM) circuit 63 according to one embodiment of the invention. In this embodiment, eight single ended data inputs (data<7:0>) 64 and an enable signal for each data bit (en_b<7:0>) 66 are input to the DTBM circuit 63. The DTBM circuit 63 performs a multiplexer process and generates dual rail outputs (o) 68 and (o_b) 70. Output 68 represents the true value of the enabled data input and output 70 represents the complement of the enabled data input. Both outputs 68 and 70 can be domino compatible. The enable inputs (en_b<7:0>) 66 can be strongly mutexed low (exactly one of these eight signals must be at a logic low state whenever signal (ck_ph1) 128 is at a logic high state).

The DTBM circuit 63 includes a first array of transistors (tru<7:0>) 72–86, a second array of transistors (cmp<7:0>) 88–102, a true value keeper transistor (tru_kp) 104, a complement value keeper transistor (cmp_kp) 106, a true value inverter (tru_drvr) 108, a complement value inverter (cmp_drvr) 110, a complement value pre-charge transistor (cmppre) 112, a true value pre-charge transistor (trupre) 114, a complement value discharge transistor (cmp_vss) 116, and a true value discharge transistor (tru_vss) 118 that form a cross-coupled differential domino circuit. The DTBM circuit 63 also includes a first circuit (tru_gen<7:0>) 130, a second circuit (cmp_gen<7:0>) 132, and a third array of transistors (xcpl<7:0>) 134–148.

The first circuit (tru_gen<7:0>) 130 inputs the data input (data<7:0>) 64 and the enable signal (en_b<7:0>) 66 and outputs a true value enable signal (tru_en<7:0>) 150. The true value enable signal (tru_en<7:0>) 150 is coupled to the first transistor array (tru<7:0>) 72–86 and the third transistor array (xcpl<7:0>) 134–148. The second circuit (cmp_ gen<7:0>) 132 inputs the data input (data<7:0>) 64 and the enable signal (en_b<7:0>) 66 and outputs a complement value enable signal (cmp_en<7:0>) 152. The complement value enable signal (cmp_en<7:0>) 152 is coupled to the second transistor array (cmp<7:0>) 88–102 and the third transistor array (xcpl<7:0>) 134–148. The third transistor array (xcpl<7:0>) 134–148 is coupled to the first transistor array (tru<7:0>) 72–86 and the second transistor array (cmp<7:0>) 88–102 such that xcpl <7:0>drive tru_en <7:0>. This third transistor array allows the tru_en signal to achieve a full logic low when the cmp_en is at a logic high state.

The pre-charge transistors 112 and 114 (trupre and cmppre) are preferably PMOS transistors and are used to pre-charge a pair of domino nodes, true value domino node (trunode0) 120 and complement value domino node (cmpnode0) 122, to Vcc (or a first reference voltage). The discharge transistors 116 and 118 (cmp_vss and tru_vss) are preferably NMOS transistors and are the domino foot devices turned on during evaluation of the DTBM circuit 63. They can also be used to discharge a pair of discharge nodes, complement value discharge node (cmp_vss) 124 and true value discharge node (tmu_vss) 126, to Vss (or a second reference voltage less than the first reference voltage). Alternatively, these two devices (116 and 118) could be combined and nodes 124 and 126 could be combined as well into a single virtual ground.

The keeper transistors 104 and 106 (tru_kp and cmp_kp) are preferably PMOS transistors and are used to hold the domino node 120 or 122 (trunode0 or cmpnode0) that did not evaluate at the pre-charge voltage level Vcc. Thus, a single-rail input (data signals 64) is input to the DTBM circuit 63 and the en_b signals 66 are used to select which data signal to propagate. The DTBM circuit 63 also inputs a clock signal (ck_ph1) 128. When the clock signal 128 is asserted, one of the domino nodes 120 or 122 will evaluate to Vss. Thus, the selected data (and its logical complement) arrive at the outputs (o) 68 and (o_b) 70.

The following mutex conditions ate preferred for operation of the DTBM circuit 63. The enable signals (en_b<7:0>) 66 can be strong mutex 0 so that exactly one of these eight signals is driven to Vss any time the clock signal (ck_ph1) 128 is asserted (i.e. driven to Vcc) while the other seven signals are driven to Vcc. This allows elimination of a half keeper that would normally be required on both domino nodes (trunode0) 120 and (cmpnode0) 122. The elimination of this keeper speeds up evaluation time and reduces power by eliminating the associated rush-through current and the extra capacitance the devices would add. In addition, true value enable signals (tru_en<7:0>) 150 and complement value enable signals (cmp_en<7:0>) 152 can be strong mutex 1 so that exactly one of these 16 signals is driven to Vcc any time clock signal (ck_13 ph1) 128 is asserted (i.e. driven to Vcc).

The first circuit (tru_gen<7:0>) 130 in FIG. 8 shows an inverter 154 in series with a NOR gate 156. Alternatively, the first circuit (tru_gen<7:0>) 130 can be implemented using a complementary device CMOS to achieve the desired logic function in just one gate delay instead of the two gate delays as is implied by the abstract logic-level view. In this alternative, a complementary device (CD) CMOS implementation of the first circuit (tru_gen<7:0>) 130 in conjunction with the corresponding third transistor array (xcpl<7:0>) 134–148 results in a propagation delay across the first circuit (tru_gen<7:0>) 130 and the second circuit (cmp_gen<7:0>) 132 are matched. Thus, the extra inversion, so problematic for conventional domino mutliplexers, is eliminated. Furthermore, both outputs 68 and 70 of the DTBM circuit 63 are domino compatible so that any following adder/logical circuits can use domino techniques.

Figure 9:
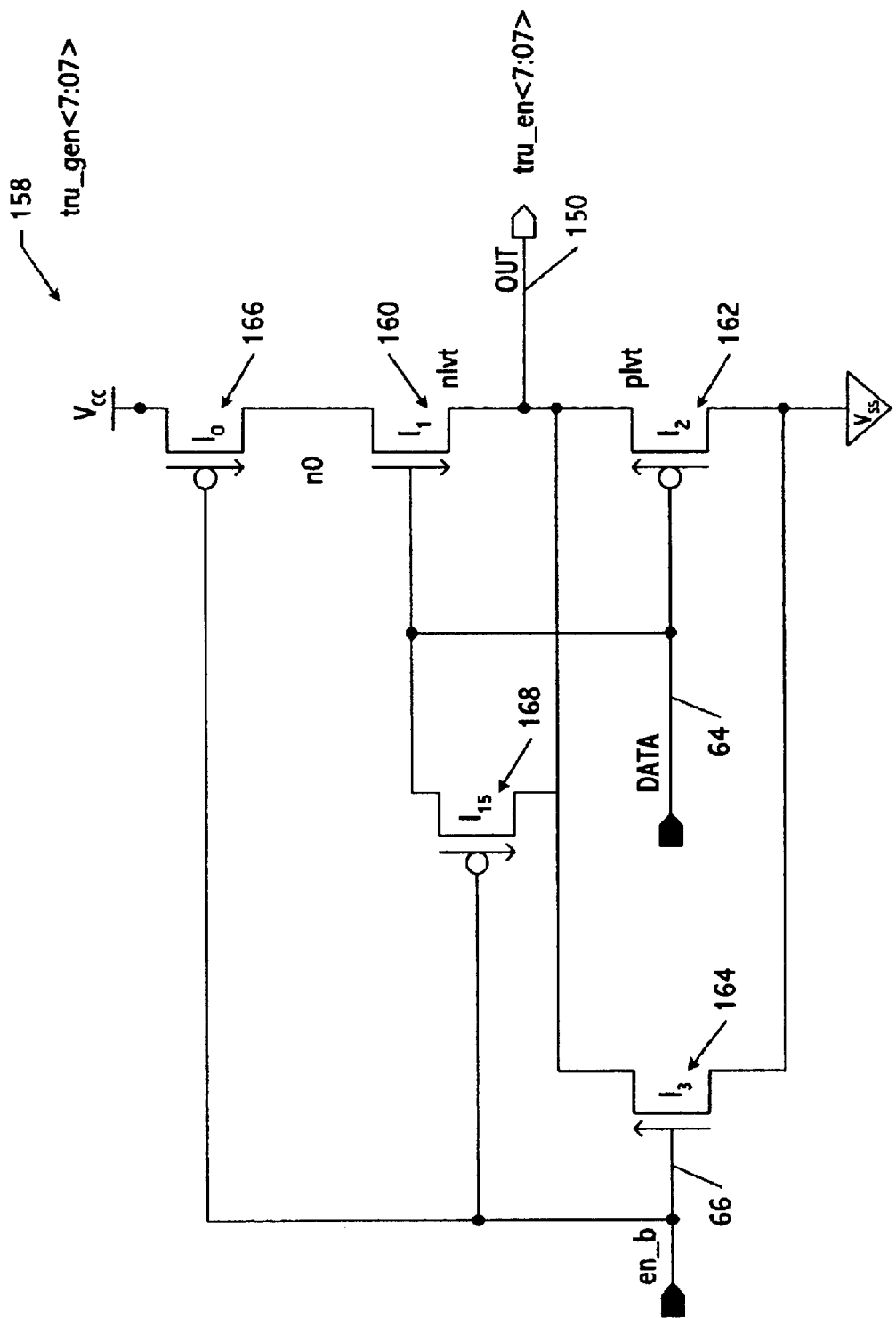
FIG. 9 illustrates a simplified circuit diagram of a true enable generation circuit according to one embodiment of the invention.

FIG. 9 illustrates an embodiment of a single (note there are 8 represented in FIG. 8) true value enable signal generator that can be used as one instance of the first circuit (tru_gen<7:0>) 130. As shown, a true value enable signal generator circuit (tru_gen<7:0>) 158 inputs the data input (data) 64 to the gate of a first transistor (i1) 160 and to the gate of a second transistor (i2) 162 and to the source of a third transistor (i15) 168. Also, the enable signal (en_b) 66 inputs to the gate of a fourth transistor (i3) 164, to the gate of a fifth transistor (i0) 166 and to the gate of the third transistor (i15) 168. The true value enable signal generator circuit (tru_gen) 158 uses the inputs 64 and 66 to generate and output a true value enable signal (tru_en) 150. The true value enable signal (tru_en<7:0>) 150 is coupled to the first transistor array (tru<7:0>) 72–86 and the third transistor array (xcpl<7:0>) 134–148. Conventional CD-CMOS devices have a significant problem in that they do not drive the output fully up to Vcc or fully down to Vss for some input vector combinations. The true value enable signal generator circuit (tru_gen<7:0>) 158 allows this limitation to be overcome by the addition of the fifth transistor (i15) 168 in conjunction with the third transistor array (xcpl<7:0>) 134–148. This combination forms a CMOS/CD-CMOS hybrid circuit. The following example shows how the output reaches full Vcc and Vss:

If en_b<0>=0 and data<0>=1 then NMOS i1 pulls the tru_en<0> signal up to Vcc–Vthn—this transition starts immediately with the asserting edge of either en_b<0> or data<0>—and PMOS i15 pulls tru_en<0> the rest of the way to Vcc; and If en_b<0>=0 and data <0>=0 then PMOS i2 pulls the tru_en<0> signal down to Vthp above Vss. The NMOS xcpl<0> is then used to finish pulling tru_en<0> all the way to Vss.

With this embodiment, while the number of devices has increased relative to other topologies, the area is comparable. Since there is only one NMOS per leg (tru* and cmp*), they are less than half the size of the NMOS devices in the other circuits that have a two NMOS stack per leg of the domino. In the DTBM circuit 63, the true value enable signal generator circuit (tru_gen<7:0>) 158 and the third transistor array (xcpl<7:0>) 134–148 provide noise immunity and full rail output levels normally provided by inverters in conventional circuits. On the whole, the net area is about the same as the conventional topologies. The layout is very dense, routable, and provides ample opportunity for symmetry and shielding of critical signals.

The DTBM circuit 63 allows time borrowing during the multiplexer operation as will be explained in one example with reference to the timing diagrams shown in FIGS. 10–15. In this example, all sixteen of the tru_en<7:0> and cmp_en<7:0> signals are mutex 1, any change of data (d) or enable (en_b) signals will impact the tru_en<7:0>/cmp_en<7:0> signal that is already active. When this action occurs after the rising edge of the clock (ck_ph1), one of the domino nodes (trunode0 or cmpnode0) has already started evaluating. The cross-coupled PMOS keeper devices (cmp_kp and tru_kp) will not start conducting until the Vgs>=Vthp. So, if the inputs (tru_en<7:0> and cmp_en<7:0>) switch after the clock, but before the cross-coupled PMOS keepers have turned on very strongly then the evaluation can be reversed. What would have normally resulted in a false evaluate (in a conventional multiplexer or domino) results in a correct evaluation. If the inputs switch after the clock and after the cross-coupled PMOS keepers have turned on, the circuit may still recover to the correct state, but it will take a very long time for the circuit to recover. Thus, time-borrowing is possible with the DTBM circuit 63 topology.

In FIGS. 10–15, all setup and borrowing times will refer to tru_en<7:0> and cmp_en<7:0> signals (inside the multiplexer) with respect to the rising edge of the clock (ck_ph1). The waves shown in these figures represent arbitrary time units as measured in a circuit simulation based on a hypothetical deep sub-micron process technology. Accordingly, those skilled in the art can appreciate that the waves are merely illustrative of at least one embodiment of the present invention, and that other waves are possible.

Figure 10:
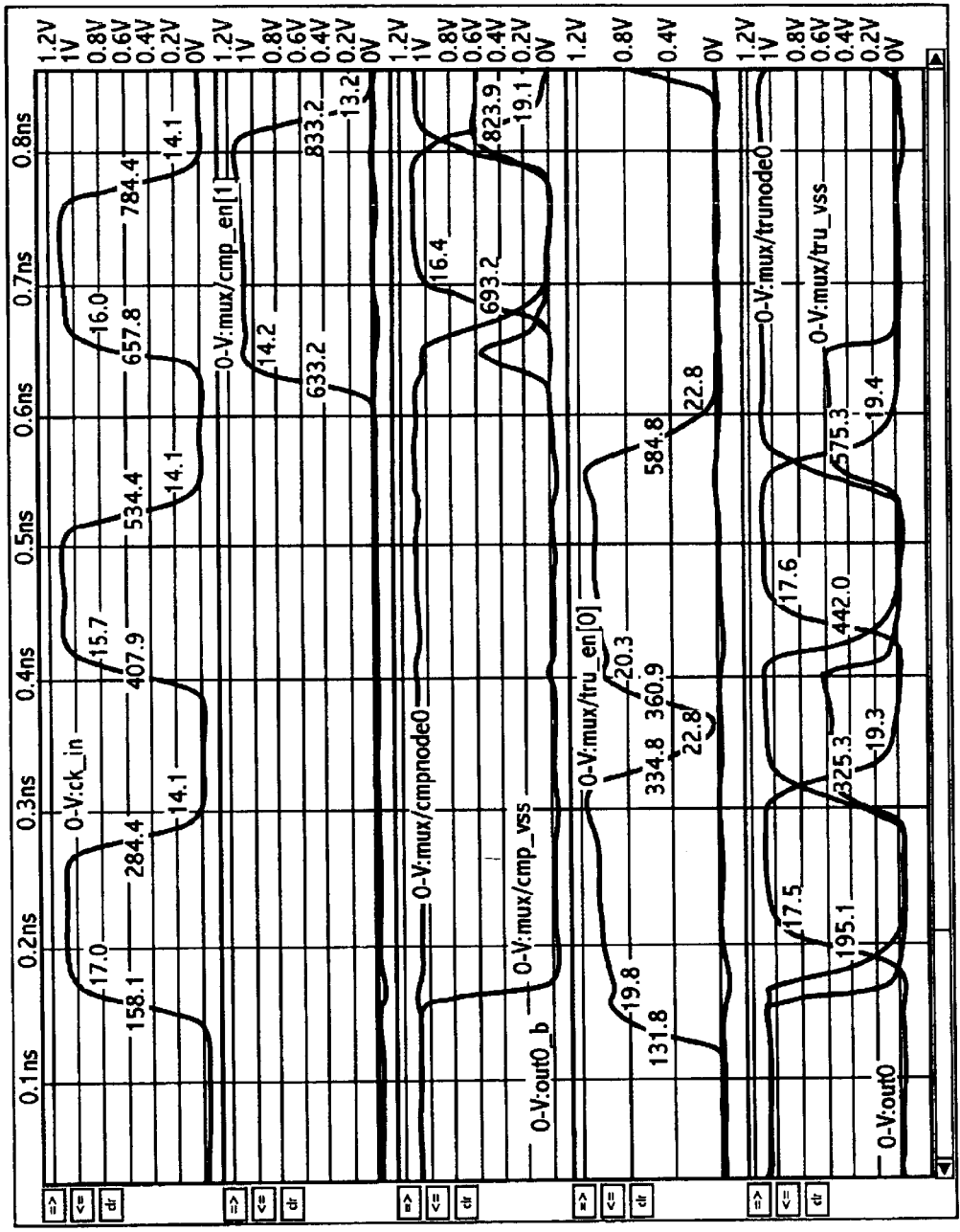
FIG. 10 illustrates a timing diagram for a dual rail time borrowing multiplexer showing the clk to out and clk to out_b assuming no borrowing according to one embodiment of the invention.

FIG. 10 shows ck_in→out0 delay of 37 units and a ck_in→out0_b delay of 36 units. In this example, the tru_en<7:0> and cmp_en<7:0> signals had set up well in advance of the rising of clock. As can be seen, there are no glitches on either domino (trunode0 or cmpnode0) nodes—unlike the conventional dual function generate (DFG) multiplexer topology, which always has a glitch on the dfgnode0 node.

Figure 11:
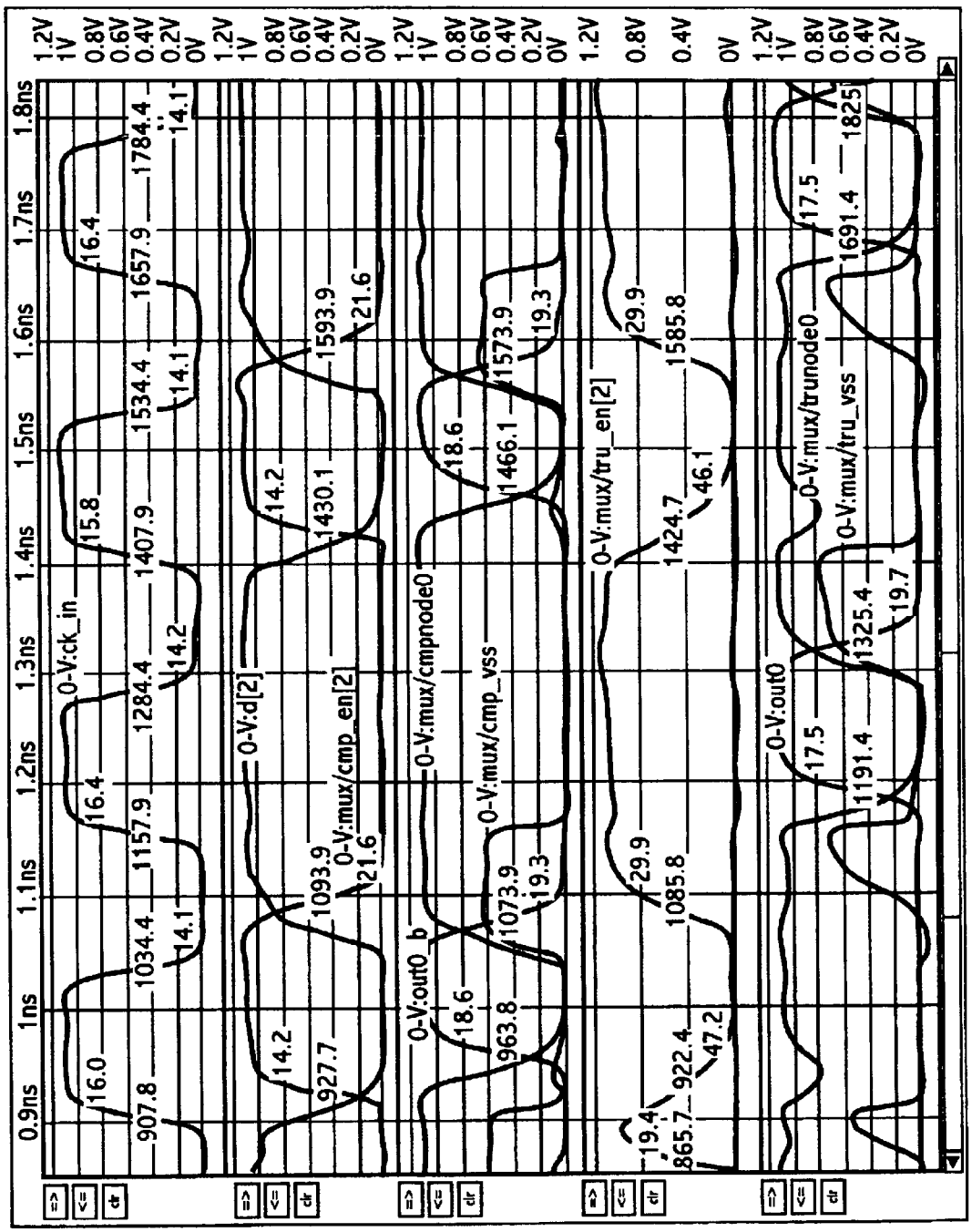
FIG. 11 illustrates a timing diagram for a dual rail time borrowing multiplexer showing data falling borrowing into the clock according to one embodiment of the invention.

FIG. 11 shows d(Falling)→cmp_en<2>(rising)→out0_b(rising) delay. The delay from cmp_en<2>(rising)→out0_b(rising) is 36 units, but cmp_en<2> did not rise (setup) until 22 units after the rising of clock. Now that the tru_en<2> and cmp_en<2> signals are transitioning after the rising of clock, FIG. 11 shows that the trunode0 started to evaluate, and then recovered. As can be seen, the inverter between trunode0 and out0 is skewed to filter this amount of noise. For each time-unit that was borrowed beyond the rising of clock, the output was delayed by one time-unit. This one-time-unit push per one-time-unit of borrowing is maintained until the false evaluate of trunode0 (in this case) starts to strongly turn on the cross-coupled PMOS keeper that would try to hold cmpnode0 (in this case) at a logic high state. At that point, and beyond, short-circuit power occurs which will slow down the recovery time.

Figure 12:
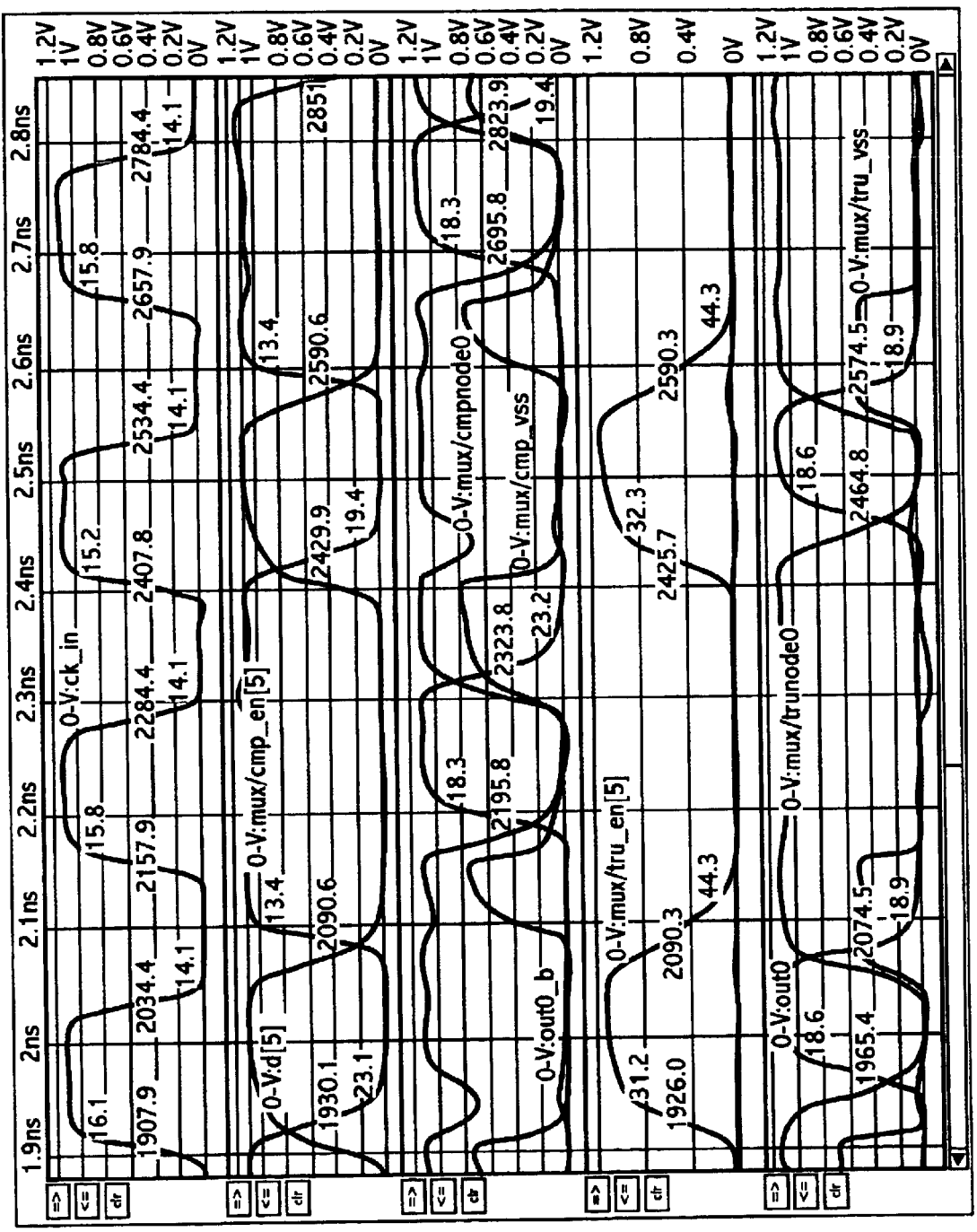
FIG. 12 illustrates a timing diagram for a dual rail time borrowing multiplexer showing data rising borrowing into the clock according to one embodiment of the invention.

FIG. 12 shows d(Rising)→tru_en<5>(rising)→out0 (rising). The delay from tru_en<5>(rising)→out0(rising) is 39 units, but tru_en<5> did not rise (setup) until 18 units after the rising of clock. Now that the tru_en<5> and cmp_en<5> signals are transitioning after the rising of clock, FIG. 12 shows that the cmpnode0 started to evaluate, and then recovered. As can be seen, the inverter between cmpnode0 and out0_b is skewed to filter this amount of noise. Again, a one-time-unit push per one-time-unit of borrowing is maintained for 18 units. The delay from the rising edge of d<5> to the falling edge of tru_en<5> is one gate delay. There is only about 4 units difference between the tru_en and cmp_en signals and only 10 units difference in 20/80 slope.

Figure 13:
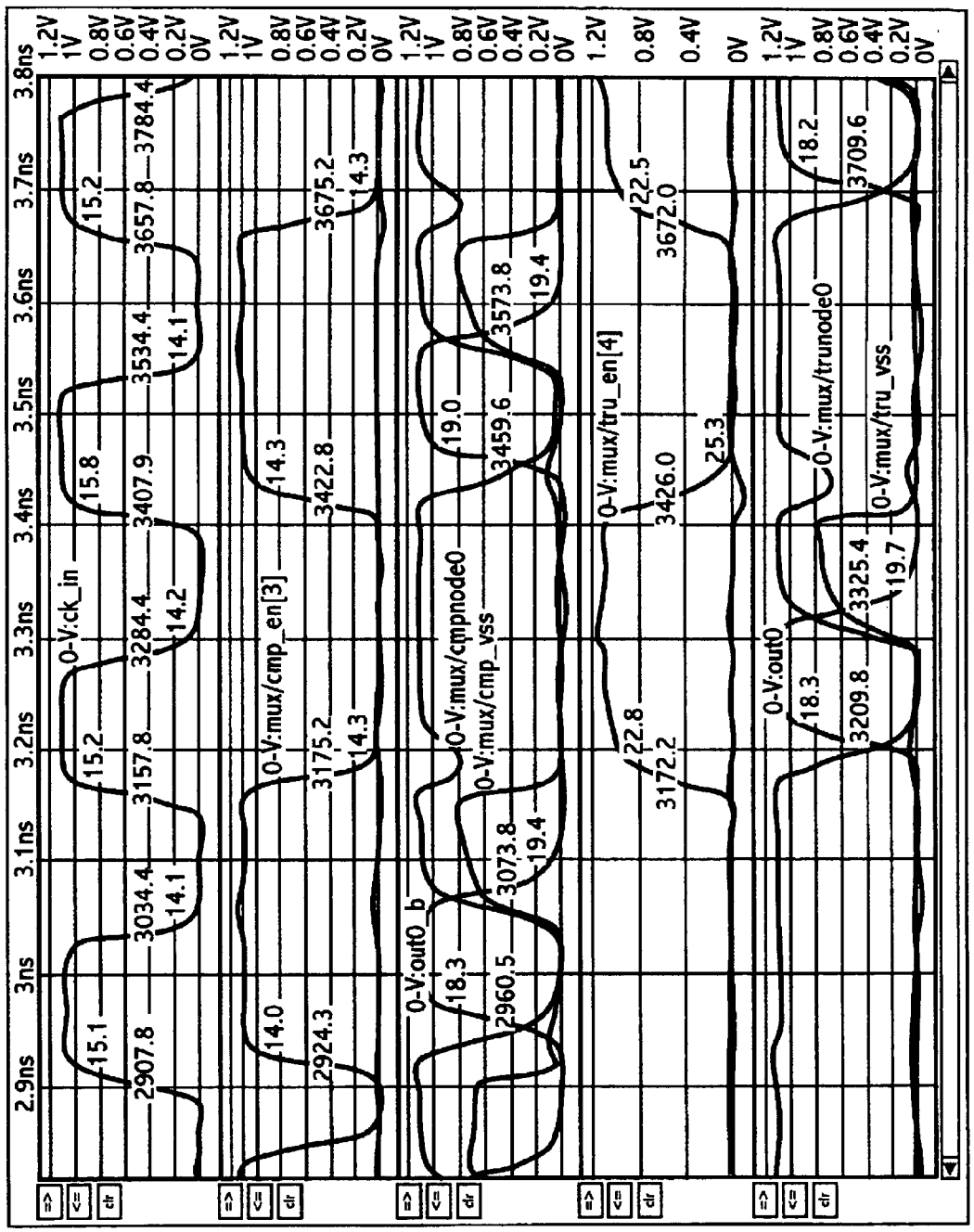
FIG. 13 illustrates a timing diagram for a dual rail time borrowing multiplexer showing the en_b falling (to either out rising or out_b rising) borrowing into the clock according to one embodiment of the invention.

FIG. 13 shows en_b(Falling)→tru_en<4>(rising)→out0 (rising). The delay from tru_en<4>(rising)→out0(rising) is 38 units, but tru_en<4> did not rise (setup) until 14 units after the rising of clock. FIG. 13 also shows en_b(Falling)→cmp_en<3>(rising)→out0_b(rising). The delay from cmp_en<3>(rising)→out0_b(rising) is 37 units, but cmp_en<3> did not setup until 15 units after the rising of the clock. Again, the wrong node began to evaluate and recovered while the noise was filtered out and does not propagate out of the multiplexer. In other words, the DTBM circuit 63 topology has a negative setup time.

Thus, the DTBM circuit 63 topology will correctly evaluate even if the inputs (tru_en<7:0> and cmp_en<7:0>) transition after the rising edge of the clock. However, it is important to consider the loop path discussed earlier.

Figure 14:
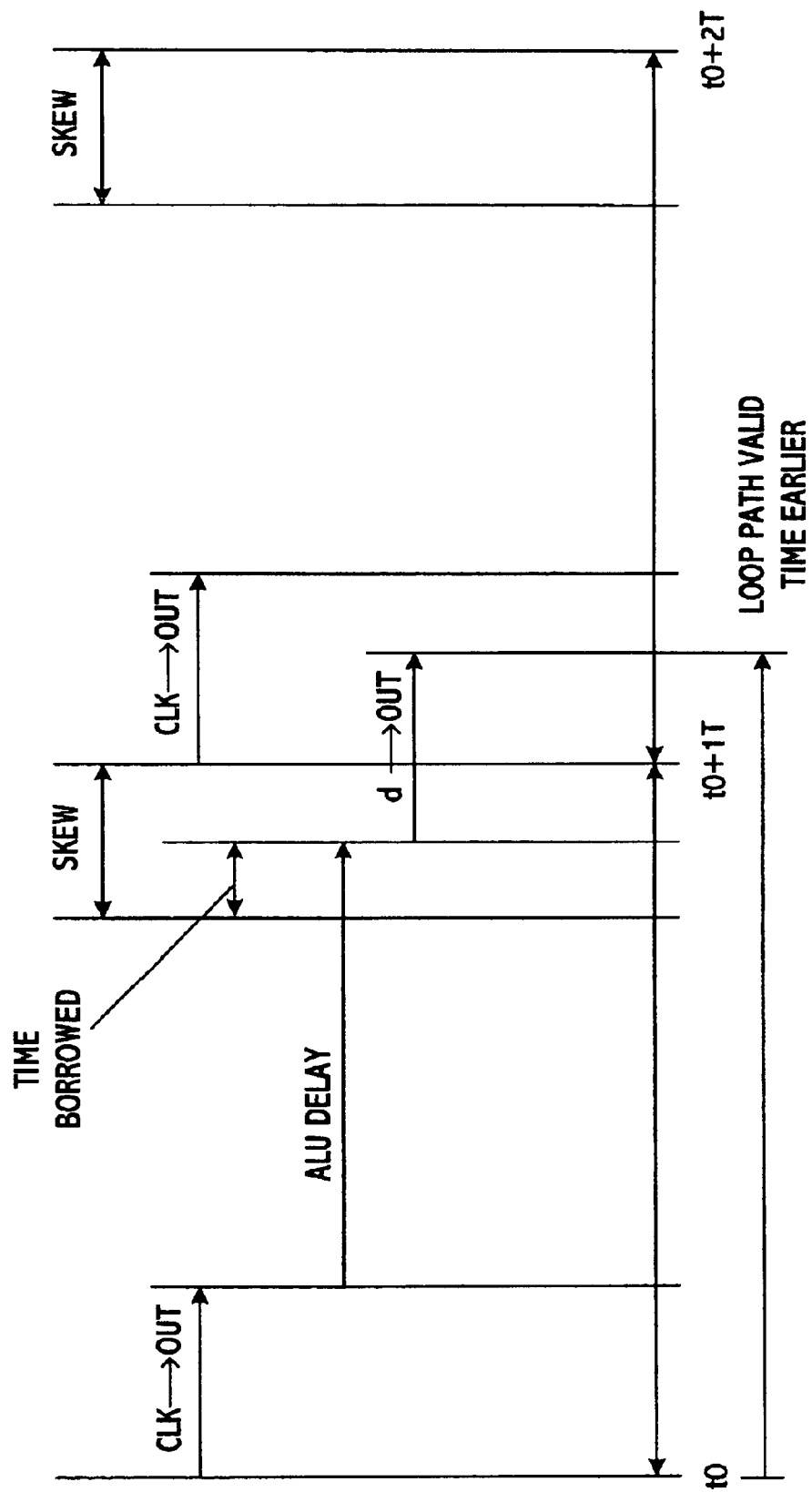
FIG. 14 illustrates a timing diagram for a dual rail time borrowing multiplexer showing the components of the fundamental speedpath for zero-level bypassing and how the borrowing can be claimed according to one embodiment of the invention.

FIG. 14 shows how the time-borrowing does not break the zero-level bypass loop path if the amount of time borrowed is less than the clock skew+clock jitter. Assuming the start of this path occurs at time zero (t0)—the latest possible arriving edge of clock. The end of the path is one clock period (T) minus clock skew (and jitter) later. Because there is a one-time-unit push (from data or enable) per one-time-unit of borrowing (against the earliest possible rising edge of clock) the loop path will not be exceeded as long as the amount of time borrowed into the multiplexer is less than the clock skew. In other words, even if the worst case skew+ jitter condition occurs, the valid time from the data and enable inputs (at the output of the multiplexer) will still be earlier than the clock-to-out time resulting from the latest arriving clock edge for consecutive ALU operations.

The DTBM circuit 63 was evaluated across several process corners, voltages and noise conditions in order to determine a preferable maximum amount of time that could be borrowed without exceeding a preferable output noise limit. The borrowing time was swept until the glitch (caused when the wrong node started to evaluate) at the output nodes (out0 or out0_b) reached 10% of Vcc (the preferable output noise limit). Furthermore, at the noise corner, noisy inputs were driven—equal to 10% of Vcc. FIG. 15 shows the results for three of these experiments. As can be seen, the results show that up to 10 units can be borrowed while still attenuating noise—even with worst case process and environment conditions, with noisy inputs. All other conditions resulted in borrowing times greater than 10 units. In comparison with conventional multiplexer circuits, the DTBM circuit 63 topology has a net 20 units improvement. A significant portion of this savings comes from the fact that the topology may borrow time (negative setup time) against the clock skew and jitter. Another significant portion comes from the elimination of an extra inverter used in the conventional topology. These savings include the fact that the tru_gen and cmp_gen (NOR) gates in the DTBM topology are slower than the corresponding inverters in the other topologies. This savings represents more than a gate delay for this process technology.

For performance reasons, microprocessor frequencies will continue to increase with time—as will the number of ALUs that operate in parallel. Reducing the functionality of individual ALUs in the execution cluster and/or limiting the zero-level bypass capabilities from each ALU to the others has both a performance impact and area/complexity impact (in the form of increased complexity of the micro-op scheduling and control circuits). Thus, the timing savings obtained by the present invention will become even more important with time. Because of the significant benefits achieved with the present invention, there are other architectural areas (other than ALUs) where the present invention topology could be used.

The foregoing embodiments disclose arrangements of PMOS and NMOS transistor for different elements. However, it should be understood that these embodiments can be modified to use different types of CMOS devices. Also, the results and timing diagrams for maximum borrowing time limits were developed using a preferred maximum limit for noise output of 10% Vcc. However, it should be understood that the maximum acceptable borrowing time can change with changes in the maximum allowable limit for noise output.

The foregoing embodiments and advantages are merely exemplary and are not to be construed as limiting the present invention. The present teaching can be readily applied to other types of apparatuses. The description of the present invention is intended to be illustrative, and not to limit the scope of the claims. Many alternatives, modifications, and variations will be apparent to those skilled in the art. In the claims, means-plus-function clauses are intended to cover the structures described herein as performing the recited function and not only structural equivalents but also equivalent structures.

What is claimed is:

1. A multiplexer, comprising:
   a first selector to generate a signal selecting one bit of a single-rail data signal;
   a second selector to generate a complement of the select signal; and
   a differential domino circuit having complementary logic blocks for each bit of the data signal, wherein the first and second selectors generate the select signal and the complement of the select signal from the single-rail data signal, and wherein the complementary logic blocks respectively output first and second values of a dual-rail data signal based on the select signal and the complement of the select signal.

2. The multiplexer of claim 1, wherein the first and second selectors respectively generate the select signal and the complement of the select signal based on an enable signal having one bit for each bit in the single-rail data signal, and wherein one of the bits in the enable signal has a different logical value to allow the first selector to generate the select signal and to allow the second selector to generate the complement of the select signal.

3. The multiplexer of claim 2, wherein the first selector includes:
   a first logic circuit to form the select signal with a first logical value and to form disable signals having a second logical value for remaining ones of the unselected bits in the single-rail data signal.

4. The multiplexer of claim 3, wherein the logic circuit includes:
   a pull-up circuit to pull up a voltage of the select signal to a first potential; and
   a pull-down circuit to pull down voltages of the disable signals to a second potential.

5. The multiplexer of claim 4, wherein the first potential is based on a supply potential and the second potential is based on a reference potential.

6. The multiplexer of claim 3, wherein the second selector includes:
   a second logic circuit to generate a complement of the first logical value for the selected bit of the single-rail data signal, and to form disable signals having a second logical value for the remaining ones of the unselected bits.

7. The multiplexer of claim 6, wherein the differential domino circuit is responsive to the second logic circuit to output the second value of the dual-rail data signal.

8. The multiplexer of claim 3, wherein the differential domino circuit is responsive to the first logic circuit to output the first value of the dual-rail data signal.

9. The multiplexer of claim 3, wherein the first logical value of the selected bit is a same logical value the selected bit assumed before input into the first selector.

10. The multiplexer of claim 3, wherein the logic circuit includes a NOR gate.

11. The method of claim 2, wherein generating the select signal includes:
    forming the select signal with logical value and forming disable signals having a second logical value for remaining ones of the unselected bits in the single-rail data signal.

12. The method of claim 11, further comprising:
    adjusting a voltage of the select signal to a first potential using one of a pull-up circuit and pull-down circuit; and
    adjusting voltages of the disable signals to a second potential using the other of the pull-up circuit and the pull-down circuit.

13. The method of claim 12, wherein the first potential is based on a supply potential and the second potential is based on a reference potential.

14. The method of claim 11, wherein the domino circuit is responsive to the select signal and the disable signals to output the first value of the dual-rail data signal.

15. The method of claim 11, wherein the first logical value of the selected bit is a same logical value the selected bit assumed before the bits of the single-rail data signal are inverted.

16. The method of claim 11, further comprising:
    generating a complement of the first logical value for the selected bit of the single-rail data signal; and
    generating complements of the second logical value for the remaining ones of the unselected bits, wherein the domino circuit outputs the second value of the dual-rail data signal based on the complement of the first logical value and the complements of the second logical value of the remaining one of the unselected bits.

17. The multiplexer of claim 1, wherein the first selector generates the select signal within one gate delay from an input of one of the first and second selectors.

18. The multiplexer of claim 17, wherein the first selector is implemented in CD-CMOS technology which allows the first selector to generate the select signal within one gate delay.

19. The multiplexer of claim 1, wherein the differential domino circuit is a time-borrowing circuit.

20. The multiplexer of claim 19, wherein the select signal is input into the differential domino circuit after an asserting edge of a clock signal which drives the domino circuit.

21. The multiplexer of claim 1, wherein the propagation delay and slopes across the complementary logic blocks in the differential domino circuit are matched.

22. The multiplexer of claim 1, wherein the first selector generates disable signals for remaining ones of the bits in the single-rail data signal, in addition to the select signal, and
    wherein the second selector generates a same logical value for input into one block of each complementary logic block in the domino circuit, and
    wherein the select signal has a first logical value and the disable signals have the logical value output from the second selector which is different from said first logical value.

23. A method, comprising:
    generating a signal selecting one bit of a single-rail data signal;
    generating a complement of the select signal from the single-rail data signal; and
    controlling outputs of complementary logic blocks in a differential domino circuit based on the select signal and the complement of the select signal, wherein the outputs of the domino circuit include first and second values of a dual-rail data signal.

24. The method of claim 23, wherein the select signal is generated within one gate delay from an input selector which generates one of the select signal and the complement of the select signal.

25. The method of claim 24, wherein the select signal is generated by a logic circuit implemented in CD-CMOS technology.

26. The method of claim 23, wherein the differential domino circuit is a time-borrowing circuit.

27. The method of claim 26, wherein the select signal is input into the differential domino circuit after an asserting edge of a clock signal which drives the domino circuit.

28. The method of claim 23, wherein the select signal and the complement of the select signal are generated based on an enable signal having one bit for each bit in the single-rail data signal, and wherein one of the bits in the enable signal has a different logical value to allow for generation of the select signal and the complement of the select signal.

29. The method of claim 23, wherein the propagation delay and slopes across complementary logic blocks in the differential domino circuit are matched.

30. The method of claim 23, further comprising:

generating disable signals for remaining ones of the bits in the single-rail data signal; and generating a same logical value for input into one block of each complementary logic block in the domino circuit, wherein the select signal has a first logical value and the disable signals have said same logical value which is different from said first logical value.

31. A system, comprising:

a first circuit; and a multiplexer having:

(a) a first selector to generate a signal selecting one bit of a single-rail data signal;

(b) a second selector to generate a complement of the select signal; and (c) a differential domino circuit having complementary logic blocks for each bit of the data signal, wherein the first and second selectors generate the select signal and the complement of the select signal from the single-rail data signal, and wherein the complementary logic blocks respectively output first and second values of a dual-rail data signal for input into the first circuit based on the select signal and the complement of the select signal.

32. The system of claim 31, wherein the first and second selectors respectively generate the select signal and the complement of the select signal based on an enable signal having one bit for each bit in the single-rail data signal, and wherein one of the bits in the enable signal has a different logical value to allow the first selector to generate the select signal and to allow the second selector to generate the complement of the select signal.

33. The system of claim 31, wherein the first selector generates disable signals for remaining ones of the bits in the single-rail data signal, in addition to the select signal, and wherein the second selector generates a same logical value for input into one block of each complementary logic block in the domino circuit, and wherein the select signal has a first logical value and the disable signals have the logical value output from the second selector which is different from said first logical value.

* * * * *